United States Patent [19]

Ross et al.

[11] 4,281,283
[45] Jul. 28, 1981

[54] AUDIO CABLE TESTER

[76] Inventors: Joseph H. Ross, 1719 San Jose Ave., Alameda, Calif. 94501; Richard J. Hall, 365 Pearl St., Livermore, Calif. 94550.

[21] Appl. No.: 20,537

[22] Filed: Mar. 14, 1979

[51] Int. Cl.³ ............................................. G01R 31/02
[52] U.S. Cl. ...................................... 324/51; 324/115
[58] Field of Search ...................... 324/51, 52, 53, 115; 340/248 R, 248 E

[56] References Cited

U.S. PATENT DOCUMENTS

| 4,118,664 | 10/1978 | Fields ...................................... 324/51 |
| 4,176,315 | 11/1979 | Sunnarborg ............................ 324/51 |

*Primary Examiner*—Michael J. Tokar
*Attorney, Agent, or Firm*—Edward B. Gregg; Willis E. Higgins

[57] ABSTRACT

A portable battery-powered audio cable tester having two jacks for connecting with the cable to be tested. A signal light and push-button "short" switch are connected with the battery such that the light will go on when a cable not having a "short" is connected to the tester and off when the "short" switch is opened, indicating such absence of a short. A second push-button "check" switch is connected across the jacks such that the tester can be checked when a malfunctioning cable is connected and the signal light fails to operate. A three position toggle switch, for indicating whether the malfunction is due to a broken conductor or an open shield, is connected so as to alternately bypass the conductor and ground wires, following release of the "check" switch. The normally open toggle switch is flipped upwardly or downwardly, such that the signal light will flash at one of the two readings, i.e., broken conductor or open shield.

1 Claim, 4 Drawing Figures

AUDIO CABLE TESTER

BACKGROUND OF THE INVENTION

Audio cables, including coaxial cables and the like used for the reproduction and amplification of sound in musical instruments, are subject to three hard-to-detect malfunctions: short circuit, open conductor, and open shield. Short circuits occur when polyvinyl chloride or nylon cables, for example, become cracked. In other cases, the center conductor or shield element of the ground conductor might become broken due to rough handling, or when the cables are unplugged with too much force. In many instances, only the slightest injury to a cable will be sufficient to alter its performance. Yet, such damage will not be apparent to the naked eye, and it will be necessary to electrically test the cable. An increasing number of audio cables utilize molded leads, in which a non-removable plastic covers the cable lead, making it impossible to check a connection without ruining the lead itself.

Malfunctioning cables, whether those found in musical instruments or in other sound systems, have previously been tested either by taking apart the lead and visually checking it, or by the use of self-enclosed adapters. Visual observation of the connections obviously requires physical opening of the connection, which, as noted, is especially unsatisfactory where molded cables are used. The self-enclosed adapter requires that the cable to be tested be taken out of the system, cut off at the end and run through the adapter. When the specific malfunction is determined, it is then necessary to prepare new cables, along with new jacks, to replace those on the tested cable. New jacks are required since there is not efficient way to remove them prior to such tests. The entire testing operation is thus expensive, due to the need for replacement of both cables and jacks, and unnecessarily elaborate and time consuming.

INVENTION

The audio cable tester of this invention comprises an electrical housing having at least two jacks for connecting with the cable to be tested. Signal light means and a push-button "short" switch are connected with a battery or other source of electrical power such that the signal light will go on when the cable is connected and off when the normally closed push-button "short" switch is operated. That is, if the signal light remains on when the "short" switch is activated, a short in the cable is indicated.

A second "check" switch, for checking out the tester itself, is connected such that when a malfunctioning cable is connected and the signal light fails to blash, the normally opened "check" switch may be pressed to bypass the faulty cable and allow the signal light to flash, indicating that the components of the tester are functioning properly.

A multiple position toggle switch is connected between the jacks and the power source and signal light such that in one position the conductor wire can be bypassed while in a second position the ground wire can be bypassed. For example, when a cable having an open center conductor is tested, the toggle switch can be flipped to bypass the conductor wire such that the signal light will flash, indicating the correct reading. Should the signal light not flash, the toggle switch need only be flipped to the second position, where the light will go on, indicating the fault to be an open shield in the ground wire.

The audio cable tester of this invention is preferably used with musical instrument cables, but such tester can be advantageously used in any sound system. As well, all different types of audio cables can be tested, including polyvinyl chloride and nylon audio cables.

The electrical components utilized in this invention are those conventionally found in electrical apparatus. The switch means preferably are push-button switches which close or open the circuit when pushed down and open or close the circuit when released. The toggle switch may be any multiple position switch having a center off position. The light means preferably comprises at least one light bulb which acts as a signal light in combination with the "short" switch, the "check" switch, and the toggle switch. Conventional light bulbs, resistors, and the like, make up the other components of the system. Any battery, such as the two-volt Duracell battery can be used in the tester, as well as any other power source. Preferably, however, all of the components will be self-contained, such that the tester will be portable.

Although the audio cable tester of this invention is shown in the drawings with only two jacks, it is clear that the same testing functions can be utilized with multiple jack audio systems. That is, multiple lead cables, such as those using three conductor wires and the like, can be tested in the same manner by providing the tester with additional jacks for the hook up.

The audio cable tester of this invention is unique in that it allows the rapid testing of three very difficult to detect cable malfunctions, namely, short circuit, open conductor, and open shield element of the ground wire. With a minimum of adjustments, the tester can test for each of these three possible malfunctions in a matter of seconds. Thus, numerous audio cables can be tested on the spot in a matter of minutes.

It is an object of this invention to provide an audio cable tester which can easily and inexpensively be used to test for audio cable malfunctions.

It is a further object of this invention to provide a tester which does not require any cutting of the cable to be tested or removal of jacks from such cable.

It is another object of this invention to provide a cable tester which can be used without any prior knowledge of the circuit to be tested.

It is another object of this invention to provide a tester which can be used simply, inexpensively and quickly to check for malfunctions in musical instrument audio cables.

REFERENCE TO DRAWINGS

DESCRIPTION OF PREFERRED EMBODIMENTS

Figure 1:
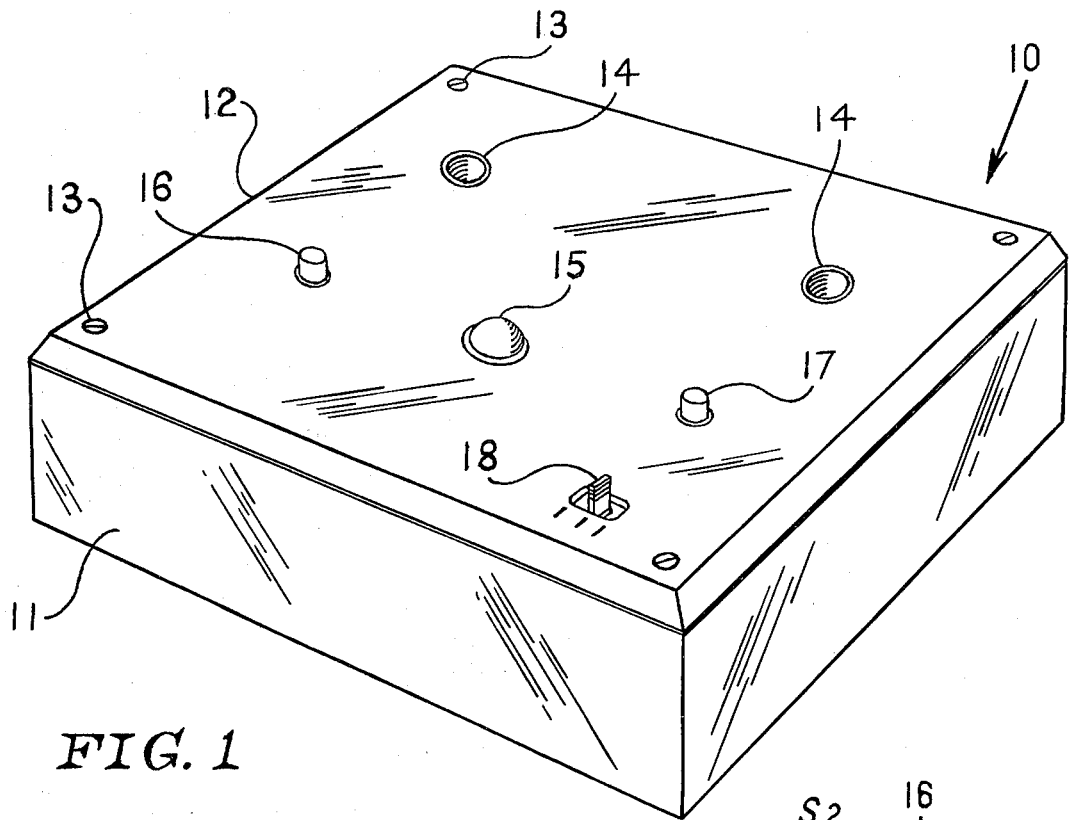
FIG. 1 is a pictorial sketch showing the electrical housing, switches, jacks, and signal light of the tester.

Referring to FIG. 1, the preferred audio cable tester 10 of this invention is a portable self-contained unit having a plastic electrical housing 11 defining a 3 inch by 4 inch by 5 inch box with a removal top 12 secured thereto by corner screws 13. Two jacks 14 are located on top of the box for connecting with the cable to be tested. A signal light 15 is located on top of the box midway between and below the location of the two jacks. A push-button "short" switch 16 in a normally closed position is located below one of the jacks, and a push-button "check" switch 17 in a normally open position is positioned below the other jack. A three position toggle switch 18 is located in the lower right corner of the box.

Figure 2:
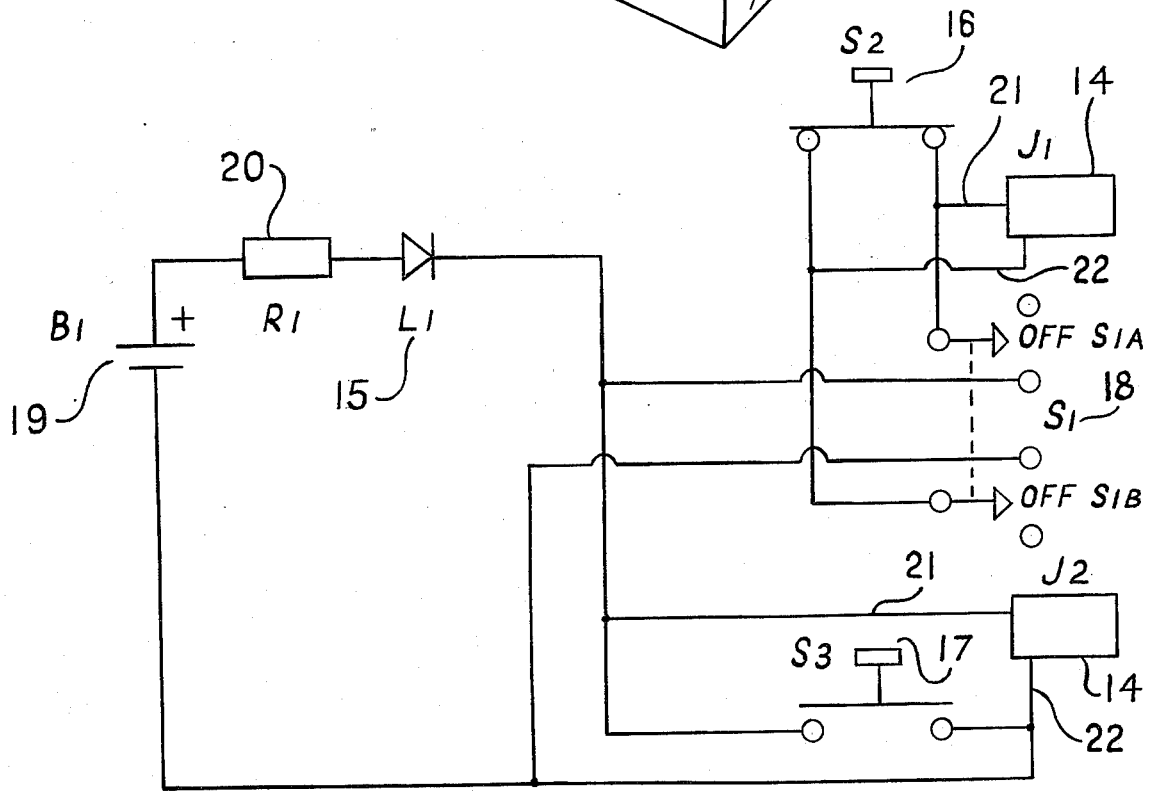
FIG. 2 is a schematic circuit diagram of the tester.

The electrical components of the tester are further shown in the schematic circuit diagram of FIG. 2. A small nine volt battery 19 supplies power through a resistor 20 to the signal light 15. The circuit is closed by the cable to be tested, such that the signal light will flash on when the cable is in good working order. The "short" switch 16 is shown in normally closed position such that the switch may be opened when a cable has been connected and the light flashes on. Should the light remain on, a short would be indicated.

The "check" switch 17 is connected across the jacks such that the battery 19, resistor 20 and signal light 15 can be tested to see that the tester itself is functioning properly when a faulty cable has been connected and the signal light does not flash on.

The toggle switch 18 is initially in an open position when the cable is connected. When the toggle switch is switched upward, the conductor wire 21 of the faulty cable is bypassed. Alternately, when the toggle switch is switched to the second position, the ground wire 22 is bypassed.

Figure 3:
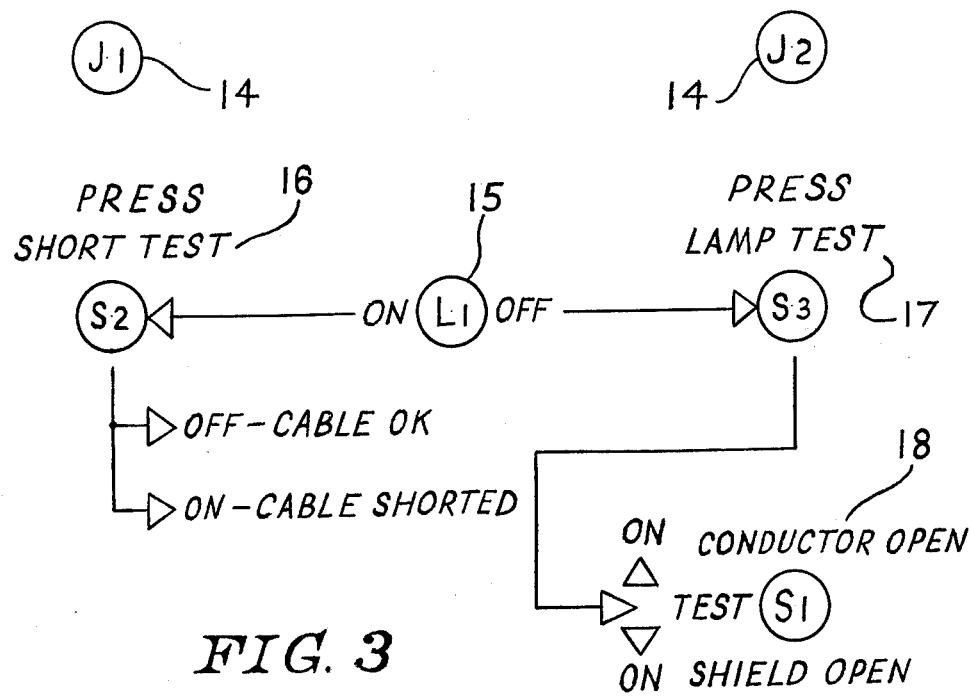
FIG. 3 is a schematic diagram showing the testing steps to be followed.

The simplicity of the tester is shown in FIG. 3. The ends of the cable are inserted into the jacks 14. If the signal light 15 flashes on, it is indicated either that the cable is in good condition or that a short circuit is present. Thus, the next step is to press the "short" push-button switch 16. If the cable is good, the light will go off. Should the light remain on, the short circuit in the cable is indicated.

When a cable is connected to the jacks and the light fails to flash on, it is first necessary to check out the tester system itself, to see that the malfunction is not in the electrical system of the tester. The "check" push-button switch 17 is thus pressed to close the circuit bypassing the jacks 14. The signal light 15 should then flash on, indicating the tester is functioning properly. The tester can then be used to test for open conductor or open shield. Before doing so, however, it will be necessary to release the "check" switch 17 so as to bring the jacks 14 and cable back into the system.

To test for an open center conductor, or shield element of the ground wire, the three position toggle switch 18 can be flipped either to an upward or a downward position. Should the light 15 flash on when the toggle switch is flipped upwardly, a broken conductor is indicated. Similarly, when the light flashes on when the switch is flipped downwardly, an open shield of the ground wire is indicated.

Figure 4:
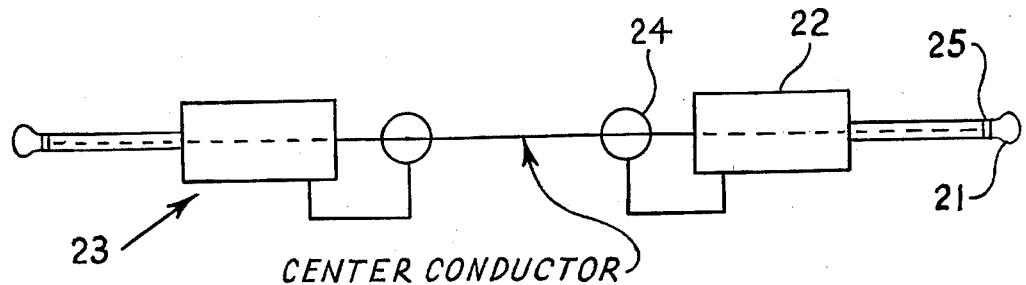
FIG. 4 is a fragmentary view of a typical audio table.

FIG. 4 illustrates a fragmentary view of a typical audio cable 23 which can be tested in the present invention. The braided shield element 24 of the ground wire 22 is separated by insulation 25 from the center conductor 21. Openings may occur in the shield element 24 where the cable has been pulled out too roughly. Similarly, breaks might occur in the center conductor 21. Since an increasing number of cable leads have molded covers, which do not permit access to either the shield or the center conductor, the tester of this invention is especially valuable for running tests for open conductors and open shields.

We claim:
1. A portable audio cable tester comprising:
a plastic electrical housing defining a box having a length of about 5 inches, a width of about 4 inches and a height of about 3 inches, the box having a removable top secured thereto by cornered screws;
two jacks located on top of the box for connecting with the to-be-tested cables;
a signal light located on top of the box midway between and below the locality of the two jacks;
a resistor connected with the signal light;
a push-button "short" switch in normally closed position located below one of the jacks and connected thereto such that when pressed the switch will open the circuit of the cable to be tested;
a push-button "check" switch in normally open position located below the second jack and connected to bypass both jacks such that when pressed the switch can activate the signal light to indicate that the tester circuit is in order;
a three position toggle switch located in a lower corner of the box and connected in normally open position such that when flipped in a first position the conductor wire will be bypassed and when flipped in a second position the ground wire will be bypassed; and
a small nine volt battery,
whereby with a minimum of adjustments, an audio cable can be quickly and inexpensively tested for short circuit, open conductor, and open shield element of the ground wire.

* * * * *